(12) United States Patent
Cain

(10) Patent No.: US 7,629,261 B2
(45) Date of Patent: Dec. 8, 2009

(54) PATTERNING METAL LAYERS

(75) Inventor: Paul A. Cain, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 8 days.

(21) Appl. No.: 11/910,813

(22) PCT Filed: Apr. 4, 2006

(86) PCT No.: PCT/GB2006/001235

§ 371 (c)(1),
(2), (4) Date: Dec. 17, 2007

(87) PCT Pub. No.: WO2006/106321

PCT Pub. Date: Oct. 12, 2006

(65) Prior Publication Data

US 2008/0153285 A1    Jun. 26, 2008

(30) Foreign Application Priority Data

Apr. 5, 2005    (GB) ................... 0506895.2

(51) Int. Cl.
*H01L 21/302* (2006.01)
*H01L 21/461* (2006.01)
(52) U.S. Cl. ............... 438/720; 257/E21.596
(58) Field of Classification Search ........ 438/707, 438/720
See application file for complete search history.

(56) References Cited

U.S. PATENT DOCUMENTS 4,882,200 A    11/1989    Liu et al.
4,898,648 A    2/1990    Cusano
2003/0211649 A1    11/2003    Hirai et al.
2004/0149986 A1    8/2004    Dubowski et al.

FOREIGN PATENT DOCUMENTS

| DE | 4011950 A1 | 10/1990 |
|----|------------|---------|
| DE | 19951721 A1 | 6/2000 |
| EP | 1 515 378 A2 | 3/2005 |
| EP | 1541974 A1 | 6/2005 |

OTHER PUBLICATIONS

German Office Action dated Feb. 25, 2009.
EPO Examination Report dated Jan. 27, 2009.
Gang Zhao et al: "Selectively Deposited Copper on Laser-Treated Polyimide Using Electroless Plating"; Proceedings of the SPIE - The International Society for Optical Engineering SPIE-INT. Soc. Opt. Eng USA, XP008065774, pp. 505-510, Jun. 7, 2000.
Yang G H et al "Thermal and Electroless Deposition of Copper on Poly (tetrafluoroet hylene-co-hexafluoropropylene) films modified by surface graft copolymerization" IEEE Trans. Adv. Packag.; IEEE Transactions on Advanced Packaging August 2002, vol. 25, No. 3, Aug. 3, 2002 pp. 365-373, XP002386865.

*Primary Examiner*—W. David Coleman
(74) *Attorney, Agent, or Firm*—Sughrue Mion, PLLC

(57) ABSTRACT

A process for fabricating an electronic device comprising the step of patterning a metallic electrode to the electronic device by laser ablation followed by electroless plating, wherein the process of fabricating the electronic device comprises at least one other laser patterning step over the area of the metallic electrode performed after said step of patterning the metallic electrode.

12 Claims, 5 Drawing Sheets

PATTERNING METAL LAYERS

CROSS REFERENCE TO RELATED APPLICATIONS

This application is a National Stage of International Application No. PCT/GB2006/001235 filed on Apr. 4, 2006, claiming priority based on British Patent Application No. 0506895.2, filed Apr. 5, 2005, the contents of all of which are incorporated herein by reference in their entirety.

The present invention relates to a method of patterning metal layers. In one embodiment, it relates to a method of patterning with high resolution a metallic layer of high conductivity for a thin film transistor device.

Thin film transistors (TFTs) are used in a variety of applications such as pixel switching transistors in active matrix displays on glass substrates, or low-cost electronic circuits, such as radiofrequency identification (RFID) tags. A conventional TFT in a top-gate architecture according to the prior art is shown in comprises source- and drain electrodes separated by the channel length L that are defined by photolithographic patterning. A semiconducting active layer island is defined by depositing the active semiconductor as a continuous layer and subsequently patterning it. A gate dielectric layer is then deposited. Finally a gate electrode is deposited and patterned on top in another photolithography step.

In order to achieve cost reduction and enable manufacturing on flexible substrate, such as plastic substrates, manufacturing processes based on alternative patterning techniques such as solution-based printing and laser ablation have been used. These are particularly applicable for material sets based on organic semiconductors, such as solution-processible polymer semiconductors or small molecule organic semiconductors, or solution-processible inorganic semiconductors, such as inorganic nanoparticles or nanowires.

Laser ablation is a well-known process for patterning of thin metal films on either rigid or flexible substrates with high-throughput. One such standard process that is known in the prior art involves patterning a film of metal deposited on a substrate. A pulsed laser is focused onto the substrate, and the metal is ablated due to thermal (or stress) confinement effects. For an industrially viable process with sufficient throughput, a laser such as an excimer or YAG laser may be used. These types of lasers have a pulse length in the region of 10 ns.

However, it has been found that a laser-ablation process according to the prior art is not entirely suitable for patterning electrodes of active semiconductor devices, such as for example, the source and drain electrodes of a thin film transistor (TFT) because unwanted topographical deformations are formed at the edge of the laser ablated pattern which reduce the efficiency of the electrode to inject charges into a semiconducting layer.

It is an aim of the present invention to provide a new technique for patterning metal layers that is better suited to the patterning of metal layers for semiconductor devices.

According to a first aspect of the present invention, there is provided a method of producing one or more semiconductor devices, including the steps of: (i) forming an initial metal layer on a substrate; (ii) ablating selected portions of the metal layer using laser pulses each of an energy sufficient to ablate the entire thickness of the initial metal layer so as to pattern the initial metal layer; (iii) selectively depositing metal on the remaining portions of the patterned metal layer so as to form a patterned metal layer of increased thickness; and (iv) providing a semiconductor or another conductor layer over the patterned metal layer of increased thickness for interaction with the patterned metal layer in the one or more semiconductor devices.

According to another aspect of the present invention, there is provided a method of patterning a further semiconductor or conductor layer provided over a patterned metal layer, the method comprising the steps of: (i) forming an initial metal layer on a substrate; (ii) ablating selected portions of the metal layer using laser pulses each of an energy sufficient to ablate the entire thickness of the initial metal layer so as to pattern the metal layer; (iii) selectively depositing metal on the remaining portions of the patterned metal layer so as to form a patterned metal layer of increased thickness; (iv) forming said further layer on the patterned metal layer of increased thickness; (v) selectively ablating portions of said further layer over the remaining portions of the patterned metal layer using laser pulses each of energy less than would be required to ablate the entire combined thickness of said further layer and patterned metal layer of increased thickness, but more than would be required to ablate the entire combined thickness of said further layer and the initial metal layer if the further layer were formed directly on the initial metal layer.

One embodiment of the present invention is a process for fabricating an electronic device comprising the step of patterning a metallic electrode to the electronic device by a process of laser ablation followed by electroless plating, wherein the process of fabricating the electronic device comprises at least one other laser patterning step over the area of the metallic electrode performed after said step of patterning the metallic electrode.

In one embodiment, the metal layer to be patterned by laser ablation has a thickness no more than $L_2$, which is the thickness of metal that can be ablated with a single laser pulse. The thickness of $L_2$ is in the region of 100-200 nm for a 308 nm excimer laser with a single pulse at ~30 ns. More preferably, it has a thickness less than $L_1$ (where $L_1<L_2$), which is the thickness at which the metal can still be patterned laterally to the same resolution, but at which vertical (topographical) issues arise: burring at the edges of the patterned metal region can create device leakage problems. $L_1$ is in the region of 30-100 nm for a 308 nm excimer laser with a single pulse length of ~30 ns.

Accordingly, for an initial metallic layer deposited and patterned on a substrate by a laser ablation process to give a good resolution and no burring, the deposited metallic layer should be $<L_1$ in order to provide the best possible resolution and edge quality, and in addition, to reduce the negative effects of debris within the active layers of the device. The patterned substrate may then be placed in an electroless plating solution, where more metal of the same type is able to grow onto the existing metal pattern, so that the vertical and lateral dimensions of the metal features increase in thickness. It is advantageous to allow sufficient metal to be grown so that the overall thickness of the metallic layer is $>L_2$. Extra metal may be grown, such that the thickness of the metal layer is of an order such that conductivity requirements may be met or exceeded for the production of a source-drain metal layer.

Upper layers of the device may then be deposited on top of the patterned and thickened initial metallic layer. If the resultant thickness of this patterned and thickened metallic layer is in excess of $L_2$, then degradation of the previously formed source-drain metal layer device may be avoided during further laser patterning steps to pattern subsequent layer of the electronic device.

In one embodiment, the method is used in the production of microelectronic devices, such as flexible displays, where a process of patterning a metal layer of a device is one of the first processing steps in a device fabrication process, with many further processing steps occurring at upper layers of the device. These further processing steps may involve similar laser patterning techniques. In order to avoid the ablation of underlying layers during subsequent ablation steps of upper layers the patterned metal layer is grown to have a thickness larger than $L_2$. For metal thicknesses larger than $L_2$, the metal layer cannot be ablated during subsequent laser patterning steps with a single laser pulse. This prevents damage or complete ablation of any portion of the patterned metal layer (such as underlying source-drain metal layer), and thus prevents destroying the functionality of the device. Accordingly severe reduction of the ablation process windows and process choices for patterning upper layers in the device structure can be avoided.

In one embodiment, the patterned metal layer is grown to have a thickness sufficient to give the conductivity required by the application and usage of the electronic device.

One embodiment of the present invention is a method of producing a metal layer of high conductivity that has been patterned to a high resolution. A thin metal film on top of a substrate with thickness less than $L_1$ is patterned on a substrate by a process of laser ablation with high resolution and with good edge definition. After the laser patterning step, the metallic layer is thickened by an electroless plating process to a thickness larger than $L_2$, i.e. beyond the damage threshold for subsequent laser patterning steps on upper layers of the electronic device. The overall thickness of the metal is now such that any subsequent laser patterning at a comparable fluence to that used in the initial ablation process or other processing steps will not further ablate or degrade the metallic layer significantly. Thus additional laser patterning processes may be used for upper layer definition, without damaging the underlying device structure.

According to a second embodiment, the electroless plating step is used to grow a low cost metal on top of a first layer of laser patterned low cost metal film. After the desired thickness of the first layer has been obtained, the substrate is immersed in an immersion bath where a displacement reaction exchanges the surface of the low-cost metal for a high (low) work function material that gives more efficient hole (electron) injection into the semiconductor layer.

To help understanding of the invention, a specific embodiment thereof will now be described, by way of example only, with reference to the accompanying drawings, in which.

Figure 3:
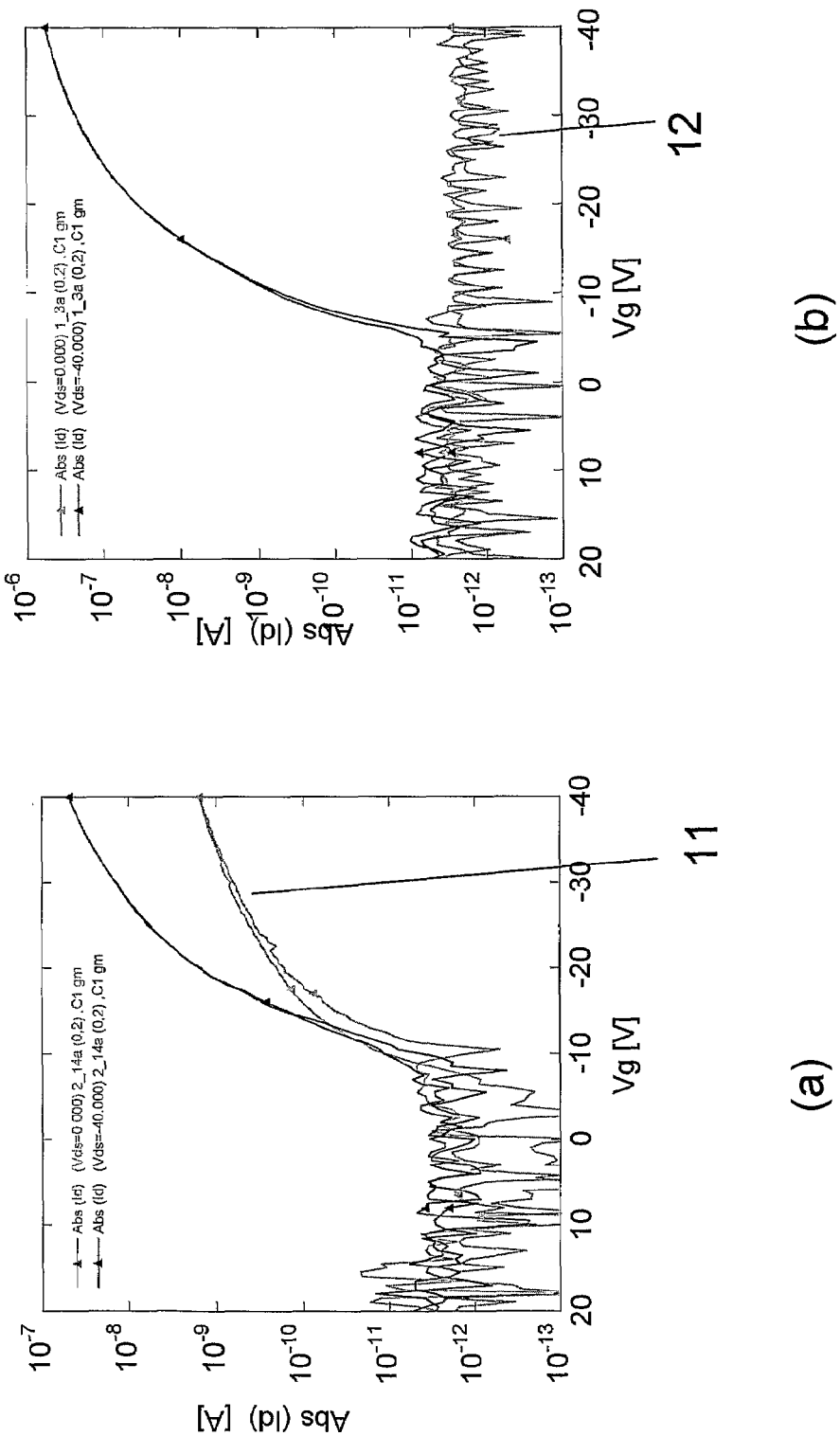

FIG. 3 shows transfer characteristics for two thin film transistor devices. In FIG. 3(a) shows the transfer characteristics for an initial layer of gold of thickness of 50 nm, before laser ablation. FIG. 3(b) shows the transfer characteristics for an initial layer of gold of thickness of 10 nm, before laser ablation.

Figure 4:
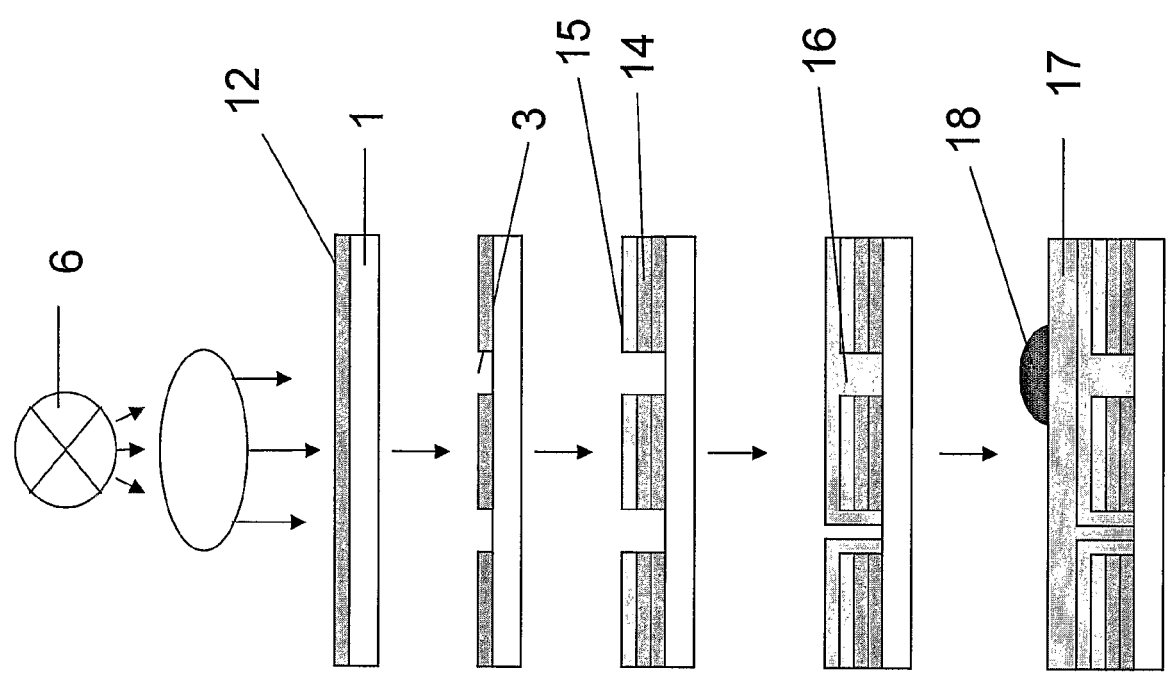

FIG. 4 illustrates the fabrication process of a transistor according to an embodiment of the claimed invention, incorporating the formation of the both the source/drain electrodes through a process of laser ablation, as well as the patterning of the semiconductor material.

Figure 5:
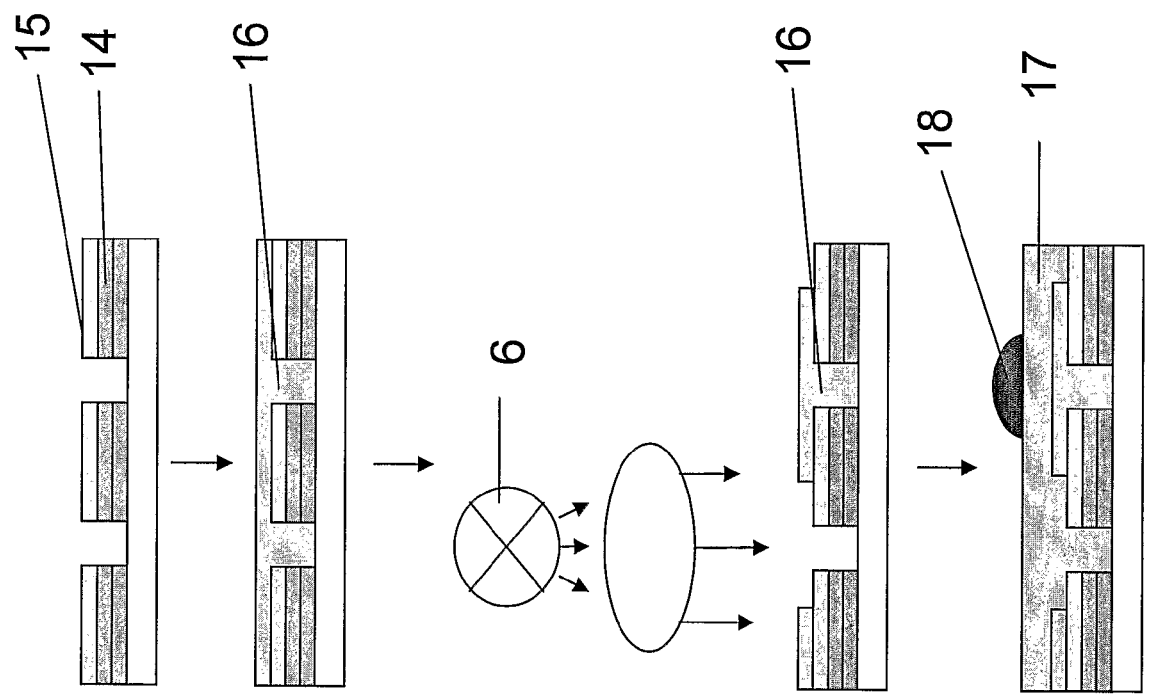

FIG. 5 shows a method of patterning a semiconductor layer according to an embodiment of the invention without damaging the underlying conductive stack.

Figure 1:
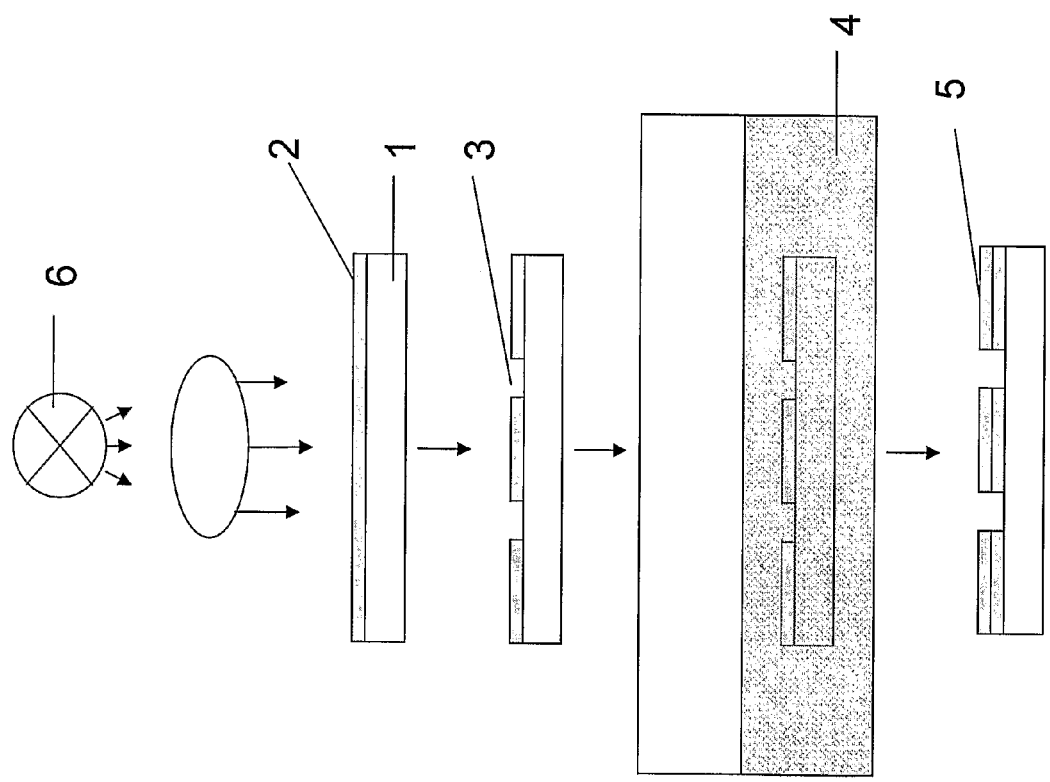
FIG. 1 illustrates a method according to an embodiment of the claimed invention for forming a thick metal film layer on a substrate that has been patterned to a high resolution.

With reference to the drawings, the first embodiment of the present invention is illustrated in FIG. 1. In order to laser-pattern a metal film coated on an insulating substrate at high resolution and with good edge definition; a metallic layer is first deposited as a thin film. After the laser patterning step, the metal layer is then thickened considerably by an electroless plating process, in order to increase the conductivity of the film. The overall thickness of the metal is now such that any subsequent laser patterning attempts at a comparable fluence to that used in the initial ablation process will not further ablate the metal significantly. Thus additional laser patterning processes may be used for upper layer definition, without damaging the underlying device structure.

A substrate 1 is coated with a thin layer of metal. The substrate may be either glass or a polymer film, but preferably PET substrates are used with a thickness of ~200 µm. An initial metallic layer 2, which is known as the seed layer, and is preferably copper and is most preferably gold, is deposited through methods such as sputtering or evaporation techniques or solution processing techniques such as spin, dip, blade, bar, slot-die, or spray coating, inkjet, gravure, offset or screen printing. A gold layer is preferably deposited at a thickness ranging from 10 nm to 60 nm. The layer must be thin enough to enable it to be processible and continuous and to minimise materials costs. A thickness of 10 nm is considered an optimum thickness. A thin metallic layer, has the advantages of being easier to ablate, in addition, it achieves the highest resolution, creates less burring and produces minimal debris within the system.

A laser beam 6, such as a 308 nm excimer laser is then used to pattern the metal layer. The laser beam may be focused onto the substrate through a mask or a direct-write focused laser beam might be used. A single pulse from the laser, with a pulse length in the region of 30 ns may be used to pattern each region of the metallic layer. This method enables the creation of lateral feature sizes, such as lines and spaces, for example, down to 2.5 µm for a 10 nm layer, and down to 4 µm for a 50 nm layer of gold. The ablation threshold for the optimal image quality is 55 mJ/cm$^2$ and 90 mJ/cm$^2$ for the aforementioned 10 nm and 50 nm layers of gold respectively. The ablation threshold for a 60 nm gold layer on a PET substrate is in the region of 106 mJ/cm$^2$. However, a gold layer of a thickness of greater than 150 nm is not able to be laser ablated by a single pulse from the excimer laser beam at a fluence in the region of 55 mJ/cm$^2$, for example, as is mentioned above for a 10 nm layer of gold. The above described laser ablation process of the thin metal layer may be used to create both the source and drain electrodes as well as the interconnect pattern of the device.

The substrate incorporating the patterned metal layer 3 of a film thickness in the region of 10 nm is then immersed within an electroless gold bath 4. A gold film 5 may then be grown on top of the initial metallic layer, for the preferred embodiment, typically to a thickness in excess of 200 nm. The electroless plating process of the metallic layer is limited to those areas of the initial metallic layer that have not been selectively ablated by the laser beam. The thicker the layer of metal grown, the higher the laser ablation threshold during subsequent laser patterning steps will be. For the metal thickness mentioned above for a gold layer, laser shots of 55 mJ/cm$^2$ are not able to ablate the gold layer. This process has the advantage of allowing further processing steps to be carried out on upper substrate layers, resulting in no damage to the underlying metallic layer. The more metal that is grown using this method of electroless plating, the higher the laser ablation threshold will be. Due to the higher metal film thickness, the metallic electrode/interconnect now has also increased electrical conductance.

Figure 2:
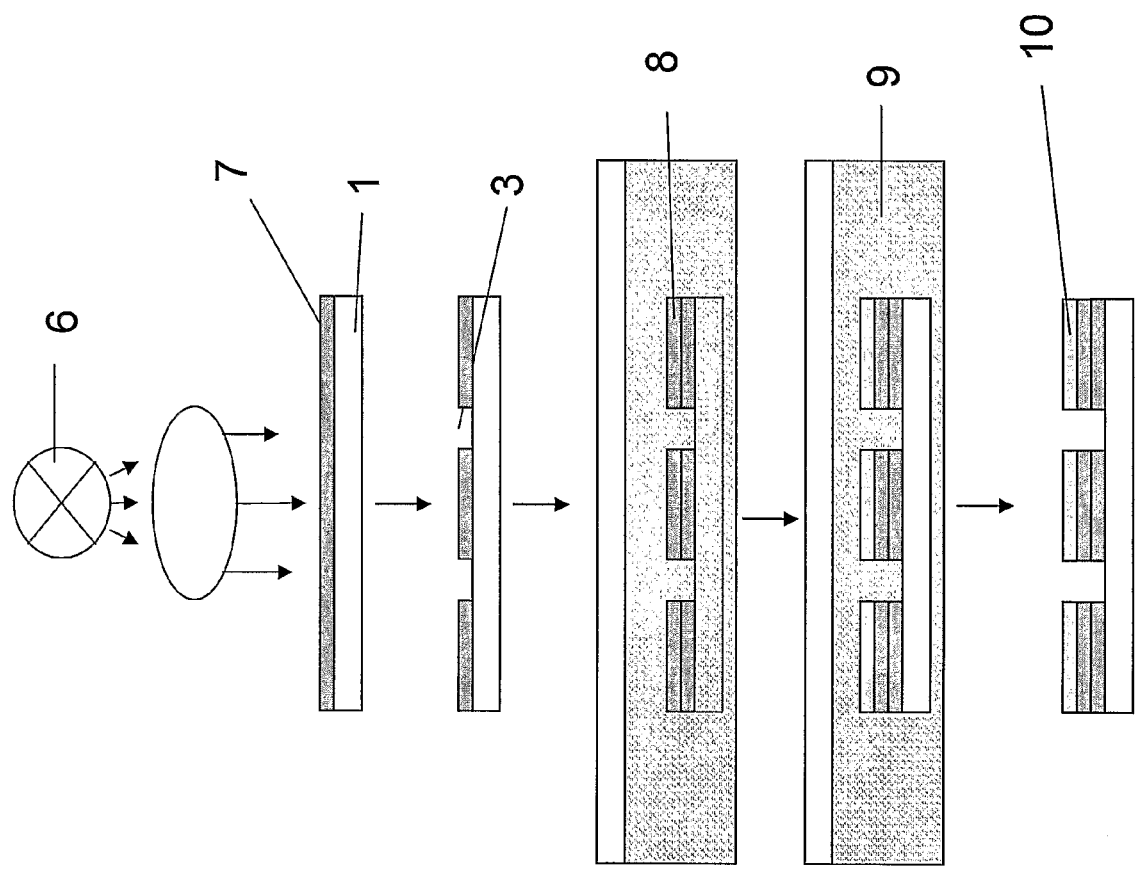
FIG. 2 shows a method according to an embodiment of the claimed invention for forming a device structure that incorporates a bilayer of metals with different physical and chemical properties.

In a second embodiment, a device structure may incorporate a bilayer of metals with different physical and chemical properties, as is shown in FIG. 2. An under layer of metal is initially deposited on the substrate and then patterned by a method of laser ablation. This metal is chosen such that it is of a low cost and a high conductivity. After patterning, more of the same metal is grown on top of said underlying layer by a process of electroless deposition until the desired layer thickness is reached. The substrate is then placed in an immersion bath where a displacement reaction exchanges the upper surface of the low-cost metal for a metal with a high work function, providing better hole injection into a p-type organic semiconductor, such as a conjugated polymer semiconductor or molecular semiconductor.

A substrate 1 is coated with a thin metallic layer 7. The substrate may be either glass or a polymer film, but preferably PET substrates are used with a thickness of ~200 μm. A metal layer, which may be nickel but is most preferably copper, is deposited through methods such as sputtering or evaporation techniques or solution processing techniques such as spin, dip, blade, bar, slot-die, or spray coating, inkjet, gravure, offset or screen printing. A preferred copper layer is preferably deposited at a thickness ranging from 10 nm to 60 nm.

A laser beam 6, such as a 308 nm excimer laser may be used to pattern the metallic layer 3 through a method of laser ablation. The laser beam may be focused onto the substrate through a mask. A single pulse from the laser, in the region of 30 ns, may be used to ablate the material in the initial metallic layer and pattern each region of the metal layer. This method enables the creation of lateral feature sizes, such as lines and spaces.

A second metal layer 8 is then grown over the initial metal layer. The second metal layer that is grown is preferably, but is not limited to the same metal as that used as the initial underlying metallic layer. However, the use of a different metallic layer may be advantageous for reasons due to cost, separate optimization of the ablating properties of the initial metal material, for example, some metals have a lower threshold to ablation than others, or because a metal with a specific work function is required at the interface between these first metal layers and subsequent semiconducting or other electroactive layers, in order to achieve good device performance. More preferably, the initial low-cost metal layer, such as, but not limited to copper is patterned by laser ablation and then thickened to a thickness designed to achieve the required conductivity. Finally a second metallic layer 10, which is preferably gold, is then grown via a displacement reaction 9 over the first layer of metal. Gold has a high work function on the order of 5.0 eV, is chemically inert, and provides good injection into a broad range of organic semiconducting materials. The thickness of the gold film can be small in order to save materials costs, and is preferably on the order of 1-10 nm. The electroless plating of the metal is limited to those areas of the initial metallic layer that have not been selectively ablated by the laser beam. The overall thickness of the metal structure is preferably on the order of 200 nm. The thicker the layer of metal grown, the higher the laser ablation threshold of the resultant metallic layer will be. This process has the advantage of allowing further processing steps to be carried out on upper substrate layers, resulting in no damage to the underlying metal layer.

When metal is grown by electroless deposition, the growth rate is typically isotropic, so that lateral as well as vertical growth will occur. This can be advantageous for defining TFT channels, because channel lengths can be shortened beyond the minimum achievable by the lithography step, simply by growing the source and drain towards each other. This places an upper limit on the gold thickness obtainable by electroless growth, since the formed source and drain electrodes must not be allowed to coalesce. In practice, this vertical limit is likely to be in the region of 10 μm, which is well beyond the thickness of gold required for most applications where small channels need to be defined. Due to the resultant metal film thickness, this metal layer now has increased in conductivity.

The process could also be repeated for upper metallic layers within a typical device structure. For example, gate electrodes are required to meet high conductivity requirements. Thus in a top-gate configuration, using the process described above, a layer of metal may be deposited on the substrate at gate level, laser patterned with an excimer laser as described above, and then grown to meet the conductivity requirement. As mentioned above, the subsequent laser patterning of additional upper layers of the device within the gate region, such as a bilayer pixel structure, may be laser patterned without degradation of underlying layers.

FIG. 3 shows transfer characteristics for two TFTs with gold source-drain electrodes patterned by laser ablation. In FIG. 3(a) the thickness of the gold source-drain layer before laser ablation patterning is 50 nm. Significant burring occurs with gold around or above 50 nm in thickness, and this often causes a vertical short between the source/drain and the gate that is situated a micron above the channel. This leakage 11 can clearly be seen in the transfer curve for $V_{ds}=0V$, rising to a few nA for $V_g=40V$.

In contrast, FIG. 3(b) shows the transfer characteristic for an initial (pre-ablation) gold thickness of 10 nm. In this case the burring has been shown to be <100 nm and does not cause device performance issues. The transfer curve at $V_{ds}=0V$ 12 shows no sign of any gate-voltage dependent leakage. Therefore, in producing TFT structures which require high conductivity interconnects, it is advantageous to start with a very thin layer of metal (10 nm), then pattern it by laser ablation, and finally grow more metal by electroless deposition to achieve a higher conductivity and ablation threshold for more robust upper level laser patterning.

Example: Fabrication of a transistor incorporating the process of adjusting the ablation threshold by electroless plating:

A method of fabricating a transistor may comprise the step of patterning a metallic electrode of the transistor by a process of laser ablation followed by a electroless plating technique, wherein the process of fabricating the transistor comprises a further laser patterning step, such as the formation of the gate electrode. FIG. 4 illustrates the fabrication process of a transistor, incorporating the formation of both the source/drain electrodes through a process of laser ablation, as well as the patterning of the semiconductor material. FIG. 5 shows a method of laser patterning the semiconductor layer without damaging the underlying conductive stack, which has an increased ablation threshold.

As stated above, a substrate 1 is coated with a thin metallic layer 12. The metal layer, which is preferably a low cost metal, such as nickel, but is most preferably copper, is deposited through methods such as sputtering or evaporation techniques or solution processing techniques such as spin, dip, blade, bar, slot-die, or spray coating, inkjet, gravure, offset or screen printing on to a substrate. A preferred copper layer is preferably deposited at a thickness ranging from 10 nm to 60 nm.

The metallic layer is then patterned through a method of laser ablation, using a 308 nm excimer laser. A single pulse from the laser, in the region of 30 ns, is used to ablate the material in the initial metallic layer and pattern each region of the metal layer.

Using an electroless plating technique, a second metal layer 14 is then grown over the initial metal layer. The second metal layer that is grown is preferably the same metal as that used as the initial underlying metallic layer. The initial low-cost metal layer is patterned by a laser ablation technique and is then thickened to a thickness designed to achieve the required conductivity. A further third metallic layer 15, which is preferably gold, is then grown via a displacement reaction using the said electroless plating technique, over the resultant first layer of metal. Gold has a high work function on the order of 5.0 eV, is chemically inert, and provides good injection into a broad range of organic semiconducting materials. The thickness of the gold film can be small in order to save materials costs, and is preferably on the order of 1-10 nm. The growth of this said second metal layer is limited to those areas of the resultant initial metallic layer that have not been selectively ablated by the laser beam. The overall thickness of the metal structure is preferably on the order of 200 nm. The thicker the layer of metal grown, the higher the laser ablation threshold of the overall resultant metallic layer will be. This process has the advantage of allowing further processing steps to be carried out on upper substrate layers, resulting in no damage to the underlying metal layer, which may be formed to produce the source and drain electrodes of the device and any interconnect lines.

A layer of semiconducting material 16 may then be deposited over the substrate and patterned source and drain electrodes. Examples of the semiconducting material may be polyarylamines, F8T2 or polythiophenes. A broad range of printing techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, blade coating or dip coating, curtain coating, meniscus coating, spray coating, or extrusion coating, but preferably spin-coated onto the substrate to give a coating ~50 nm thick after solvent evaporation. In addition, an evaporative process may also be used. If the layer is ink jet printed, a minimum amount of semiconductor material may be used, which is both environmentally and economically advantageous. If the semiconducting material is deposited via a coating technique, the active semiconducting layer needs to be isolated between devices for many TFT applications. This is necessary in order to reduce electrical crosstalk and eliminate parasitic leakage currents between neighbouring devices. The semiconductor layer may be patterned using a pulsed laser beam 6 at a wavelength that is absorbed by the layer of semiconducting material.

The ablation occurs by focusing a 248 nm KrF excimer laser (Lumonics PM800), onto a substrate through a mask pattern to give the required semiconductor pattern, in a step-and-repeat process. In a deliberately overdosing approach, a two-shot process is used, with each shot at a fluence 650 mJ/cm$^2$. The ablation to the semiconductor material occurs via thermal and stress confinement effects from the localised photon flux.

This method ensures that any underlying metallised regions, for example, any interconnects that have been formed remain unaffected by the ablation of the semiconductor material. This is because the fluence used, as stated above, is not sufficient to ablate the thickened metallised layer, produced by the electroless plating technique described above. The underlying formed source and drain electrodes are now electrically isolated with respect to neighbouring source and drain electrodes. This process proceeds with limited amounts of debris being produced.

Then a layer of gate dielectric 17 or a sequence of dielectric layers is deposited on top of the semiconducting layer. Materials such as polyisobutylene, polymethylmethacrylate, polystyrene or polyvinylphenol may be used for the dielectric layer. The dielectric material may be deposited in the form of a continuous layer, by techniques such as, but not limited to, spray or blade coating. However, preferably, the technique of spray coating is used. The typical thickness of the gate dielectric layer is between 150-1000 nm.

The deposition of the layer of dielectric material is then followed by the deposition of a gate electrode 18 and interconnect lines. The gate electrode and interconnect lines may consist of a conducting polymer, such as polyethylenedioxythiophene doped with polystyrene sulfonic acid (PEDOT/PSS). However, the gate electrode is preferably a metallic material, such as gold, but most preferably, a printable liquid containing inorganic nanoparticles of silver or gold. The gate electrode is deposited and patterned using techniques such as sputtering or evaporation photolithography or deposited and patterned by solution processing techniques such as spin, dip, blade, bar, slot-die, gravure, offset or screen printing. The gate electrode may be deposited by ink jet printing. A gate electrode wetting layer, such as a layer of polyvinylphenol, maybe deposited onto the substrate prior to the printing of the metal ink.

Preferably the gate electrode is a film of gold or copper patterned by selective laser ablation patterning (SLAP), (as explained in an earlier patent, see GB0513915.9) The technique of SLAP is a method of producing fine features of a device using short pulse lasers for the fabrication of thin film transistor (TFT) structures. This technique incorporating laser ablation uses a single shot per imaging area of a short pulse laser to pattern layers of metallic material on top of underlying layers in order to produce fine features of a TFT device. An example is the patterning of a gold gate electrode of a top-gate organic TFT with underlying gate dielectric, active semiconductor and conducting source-drain electrode layers. This technique may be performed without destroying or substantially degrading the performance of these sensitive elements, such as the semiconductor layer and the source-drain electrodes. This is due to the short pulse length allowing all of the energy of an ultra-short laser beam to enter the material and to be absorbed within the layer to be ablated which will result in the act of ablation before any substantial thermalization actually occurs, that can lead to degradation/ablation of underlying layer. In addition, this technique may be used to finely tune the source and drain electrode formation after a coarser laser ablation process, resulting in the substantial elimination of burring edges that could lead to electrical shorts. In addition, this technique is able to be used to remove small areas of unwanted conductive material, for example, those that have been formed as a result of the production of debris.

A pulsed UV laser such as a 248 nm excimer is used to pattern the film of metal to form gate structures. The metal is thin enough (<200 nm) to be patterned by laser ablation at a low fluence (~100 mJ/cm$^2$) but thick enough (>10 nm) to absorb a vast majority of the laser radiation (absorbance >1), thus preventing damage to the underlying source and drain electrodes. Also, since the underlying source and drain metallic electrodes have a high ablation threshold because of their thickness, any small amount of radiation that penetrates the upper metallic layer will be much less than the fluence required to ablate them.

The processes and devices described herein are not limited to devices fabricated with solution-processed polymers. Some of the conducting electrodes of the TFT and/or the interconnects in a circuit or display device (see below) may be formed from, for example, inorganic conductors, that are able to, for example, be deposited by the printing of a colloidal suspension or by electroplating onto a pre-patterned substrate.

Possible materials that may be used for the semiconducting layer, includes any solution processible conjugated polymeric or oligomeric material that exhibits adequate field-effect mobilities exceeding $10^{-3}$ cm$^2$/Vs and preferably exceeding $10^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic nanowires.

Although preferably all layers and components of the device and circuit are deposited and patterned by solution processing and printing techniques, one or more components may, for example, also be deposited by vacuum deposition techniques and/or patterned by photolithographic processes.

Devices such as TFTs fabricated as described above may, for example, be part of more complex circuits or devices, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing one or more semiconductor devices, including the steps of: (i) forming an initial metal layer on a substrate; (ii) ablating selected portions of the metal layer using laser pulses each of an energy sufficient to ablate the entire thickness of the initial metal layer so as to pattern the initial metal layer; (iii) selectively depositing metal on the remaining portions of the patterned metal layer so as to form a patterned metal layer of increased thickness; and (iv) providing a semiconductor or another conductor layer over the patterned metal layer of increased thickness for interaction with the patterned metal layer in the one or more semiconductor devices.

2. A method according to claim 1, further comprising the step of selectively ablating portions of the semiconductor or another conductor layer over the patterned metal layer of increased thickness using laser pulses of energy less than would be required to ablate the entire combined thickness of the semiconductor or another conductor layer and patterned metal layer of increased thickness, but more than would be required to ablate the entire combined thickness of the semiconductor layer and the initial metal layer if the semiconductor layer were formed directly on the initial metal layer.

3. A method of producing a plurality of semiconductor devices according to claim 1, wherein the patterned metal layer defines one or more metal electrodes for each of the plurality of semiconductor devices and also defines one or more interconnects connecting electrodes of one or more the plurality of semiconductor devices.

4. A method according to claim 1, wherein the patterned metal layer defines source and drain electrodes for each of the one or more semiconductor devices.

5. A method according to claim 1, wherein the step of selectively depositing metal on the remaining portions of the patterned metal layer comprises a first sub-step of selectively depositing a first metal on the remaining portions of the patterned metal layer and then selectively depositing a second metal on the first metal.

6. A method according to claim 1, wherein the step of selectively depositing metal on the remaining portions of the patterned metal layer is carried out by electroless plating.

7. A method according to claim 1, wherein the thickness of the initial metal layer is about 10 nm or less.

8. A method according to claim 1, wherein the metal selectively deposited on the remaining portions of the patterned layer is a different metal as that of the initial metal layer.

9. A method according to claim 5, wherein the second metal layer has a different workfunction than the first metal layer.

10. A method of patterning a further semiconductor or conductor layer provided over a patterned metal layer, the method comprising the steps of: (i) forming an initial metal layer on a substrate; (ii) ablating selected portions of the metal layer using laser pulses each of an energy sufficient to ablate the entire thickness of the initial metal layer so as to pattern the metal layer; (iii) selectively depositing metal on the remaining portions of the patterned metal layer so as to form a patterned metal layer of increased thickness; (iv) forming said further layer on the patterned metal layer of increased thickness; (v) selectively ablating portions of said further layer over the remaining portions of the patterned metal layer using laser pulses each of energy less than would be required to ablate the entire combined thickness of said further layer and patterned metal layer of increased thickness, but more than would be required to ablate the entire combined thickness of said further layer and the initial metal layer if the further layer were formed directly on the initial metal layer.

11. A method as claimed in claim 10, comprising the additional step of depositing a dielectric layer in between said patterned metal layer and said further layer.

12. A method as claimed in claim ,10 wherein said further semiconductor layer comprises an organic semiconductor.

* * * * *